United States Patent
Van Der Velden et al.

(10) Patent No.: US 7,491,951 B2
(45) Date of Patent: Feb. 17, 2009

(54) LITHOGRAPHIC APPARATUS, SYSTEM AND DEVICE MANUFACTURING METHOD

(75) Inventors: Marc Hubertus Lorenz Van Der Velden, Eindhoven (NL); Vadim Yevgenyevich Banine, Helmond (NL); Bastiaan Matthias Mertens, 's-Gravenhage (NL); Johannes Hubertus Josephina Moors, Helmond (NL); Markus Weiss, Aalen (DE); Bastiaan Theodoor Wolschrijn, Abcoude (NL); Michiel D. Nijkerk, Amsterdam (NL)

(73) Assignees: ASML Netherlands B.V., Veldhoven (NL); Carl Zeiss SMT AG, Oberkochen (DE)

(*) Notice: Subject to any disclaimer, the term of this patent is extended or adjusted under 35 U.S.C. 154(b) by 417 days.

(21) Appl. No.: 11/319,193

(22) Filed: Dec. 28, 2005

(65) Prior Publication Data

US 2007/0146660 A1   Jun. 28, 2007

(51) Int. Cl.
*G03B 27/52* (2006.01)
*G03F 7/20* (2006.01)

(52) U.S. Cl. .................................. 250/492.2
(58) Field of Classification Search ............. 250/492.2
See application file for complete search history.

(56) References Cited

U.S. PATENT DOCUMENTS

| | | | | |
|---|---|---|---|---|
| 6,479,830 B1* | 11/2002 | Fornaca et al. | ......... | 250/492.21 |
| 6,781,673 B2* | 8/2004 | Moors et al. | ......... | 355/76 |
| 7,183,717 B2* | 2/2007 | Smith et al. | ......... | 315/111.51 |
| 7,217,941 B2* | 5/2007 | Rettig et al. | ......... | 250/504 R |
| 2004/0179182 A1* | 9/2004 | Bakker | ......... | 355/69 |

\* cited by examiner

*Primary Examiner*—Jack I Berman
(74) *Attorney, Agent, or Firm*—Pillsbury Winthrop Shaw Pittman, LLP

(57) ABSTRACT

The invention relates to a lithographic apparatus that includes a system configured to condition a radiation beam or project a patterned radiation beam onto a target portion of a substrate. The system includes an optically active device configured to direct the radiation beam or the patterned radiation beam, respectively, and a support structure configured to support the optically active device. The apparatus further includes a gas supply for providing a background gas into the system. The radiation beam or patterned radiation beam react with the background gas to form a plasma that includes a plurality of ions. The support structure includes an element that includes a material that has a low sputtering yield, a high sputter threshold energy, or a high ion implantation yield, to reduce sputtering and the creation of sputtering products.

47 Claims, 7 Drawing Sheets

LITHOGRAPHIC APPARATUS, SYSTEM AND DEVICE MANUFACTURING METHOD

FIELD

The present invention relates to a lithographic apparatus, a system, and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In lithographic apparatus, a background gas may be introduced, for example, a flushing gas or a background gas in a projection optics box in a lithographic apparatus operating in the extreme ultraviolet radiation range. The radiation, for example, EUV radiation, but also other radiation, for example, 157 nm, 193 nm and a particle beam, generated by the radiation source may be partially absorbed by the background gas. The radiation may also ionize the background gas, on-setting the creation of a plasma. The creation of free charges (electrons and ions) may lead to avalanche effects when the interaction of electrons and molecules leads to the creation of more free charges. This effect may be accelerated by electrical fields, which may be externally applied or radiation induced by the photo-electric effect. Under the influence of electric fields, the free charges in the plasma may reorganize themselves. Eventually, this may lead to quasi-neutrality in which there is no electrical field in the bulk of the plasma. Near a surface of the lithographic apparatus, a potential drop may arise. Accelerated ions in such potential drop may impact on surfaces in the lithographic apparatus, including optical elements such as mirrors and lenses, resulting in processes, such as etching and sputtering.

In particular, in a lithographic apparatus operating in the EUV range, electrical fields may be built up due to the strongly ionizing photons. These electrical fields lead to acceleration of ions and thus, to sputtering and etching inside the projection optics box. Solutions may include protecting the multilayer mirrors and other sensitive devices from etching/sputtering ions by the creation of electrical fields oriented away from the mirrors. However, creation of an electrical field away from mirrors may lead to an acceleration of ions from the mirrors to, for example, a lens structure. In that case, the etching and sputtering may take place at the lens structure instead, which is also undesirable, since products of the etching and sputtering processes may deposit on the mirrors, again leading to a decrease of the lifetime of expensive optical elements. Further, a transmission loss and/or a homogeneity loss may also occur. Some of the optical elements may be protected by a thin top layer whose removal is undesirable.

SUMMARY

It would be advantageous, for example, to provide a lithographic apparatus in which the effects of ionization of a background gas are reduced.

In particular, it would be advantageous, for example, to provide a lithographic apparatus in which the effects of sputtering and/or etching of optical elements in the lithographic apparatus are reduced.

It would be further advantageous, for example, to provide a lithographic apparatus in which the effects of one or more processes which may occur as a result of ionization, for example, etching and/or sputtering processes, are reduced.

According to an aspect of the invention, there is provided a lithographic apparatus. The lithographic apparatus includes a system configured to condition a radiation beam or project a patterned radiation beam onto a target portion of a substrate. The system includes an optically active device configured to direct the radiation beam or the patterned radiation beam, respectively, and a support structure configured to support the optically active device. The support structure includes an element comprising a material having a low sputtering yield, a high sputter threshold energy, or a high ion implantation yield, to reduce an effect of ions, or the support structure includes a material with a low yield of secondary electrons on ion impact to reduce the probability of plasma breakdown. The apparatus also includes a gas supply for providing a background gas into the system. The radiation beam or patterned radiation beam interacts with the background gas to form a plasma comprising a plurality of ions.

According to an aspect of the invention, there is provided a lithographic apparatus. The lithographic apparatus includes a system configured to condition a radiation beam or project a patterned radiation beam onto a target portion of a substrate. The system includes an optically active device configured to direct the radiation beam or the patterned radiation beam, respectively, and a support structure configured to support the optically active device. The support structure includes an element configured to reduce an effect of ions, or includes a material with a low yield of secondary electrons on ion impact to reduce the probability of plasma breakdown by decreasing the possibility that the sputtering products reach the optically active device. The apparatus also includes a gas supply for providing a background gas into the system. The radiation beam or patterned radiation beam interacts with the background gas to form a plasma comprising a plurality of ions. The plurality of ions generate a plurality of sputter products as a result of an impact of the plurality of ions with the system.

According to an aspect of the invention, there is provided a lithographic projection apparatus arranged to project a pattern from a patterning device onto a substrate. The lithographic projection apparatus includes a system configured to condition a radiation beam or project a patterned radiation beam onto a target portion of the substrate. The system includes an optically active device configured to direct the radiation beam or the patterned radiation beam, respectively, and a support structure configured to support the optically active device. The support structure includes an element that includes a material having a low sputtering yield, a high sputter threshold energy, or a high ion implantation yield, to reduce an effect of ions, or the support structure includes a material with a low yield of secondary electrons on ion impact to reduce the probability of plasma breakdown. The apparatus also includes a gas supply for providing a background gas into the system. The radiation beam or patterned radiation beam react with the background gas to form a plasma comprising a plurality of ions.

According to an aspect of the invention, there is provided a system configured to condition a radiation beam or project a patterned radiation beam onto a target portion of a substrate. The system includes an optically active device configured to direct the radiation beam or the patterned radiation beam, respectively and a support structure configured to support the optically active device. The support structure includes an element that includes a material having a low sputtering yield, a high sputter threshold energy, or a high ion implantation yield, to reduce an effect of ions, or the support structure includes a material with a low yield of secondary electrons on ion impact to reduce the probability of plasma breakdown. The system also includes a gas supply for providing a background gas into the system. The radiation beam or patterned radiation beam reacts with the background gas to form a plasma comprising a plurality of ions.

According to an aspect of the invention, there is provided a device manufacturing method that includes projecting a patterned beam of radiation through a system onto a target portion of a substrate or conditioning a radiation beam in a system, directing the radiation beam or the patterned radiation beam through the system using an optically active device, supporting the optically active device with a support structure, supplying a gas supply for providing a background gas into the system, the radiation beam or patterned radiation beam interacting with the background gas to form a plasma comprising a plurality of ions, and providing an element in the support structure. The element includes a material having a low sputtering yield, a high sputter threshold energy, or a high ion implantation yield, to reduce an effect of ions, or the element includes a material with a low yield of secondary electrons on ion impact to reduce the probability of plasma breakdown.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
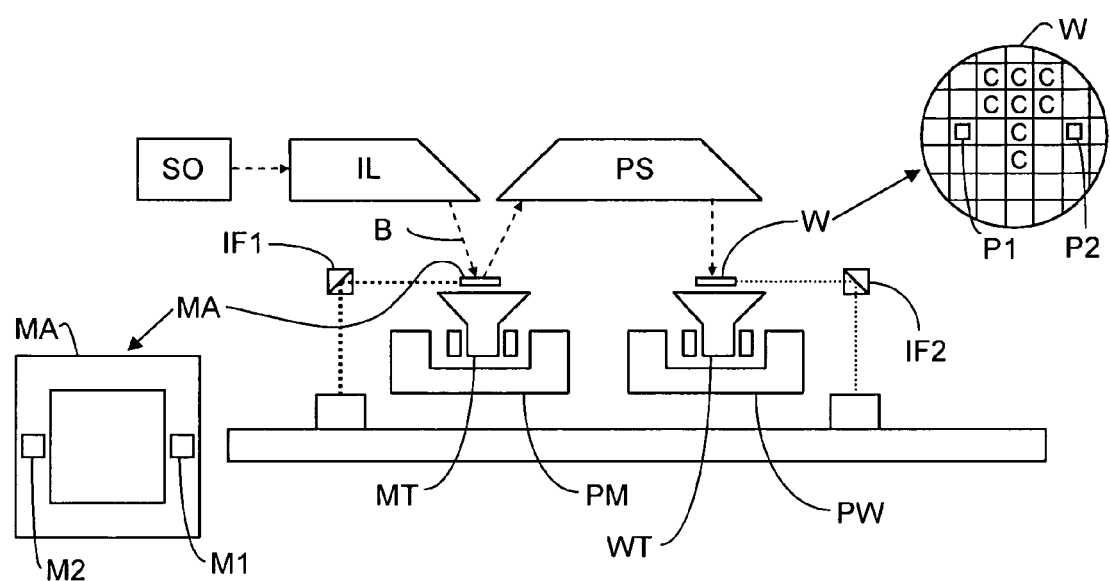
FIG. 1 depicts a lithographic apparatus according to an embodiment of the invention.

FIG. 1 schematically depicts a lithographic apparatus according to one embodiment of the invention. The apparatus comprises an illumination system (illuminator) IL configured to condition a radiation beam B (e.g. UV radiation or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type in which at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus may be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The occurrence of breakdown in a gas discharge is a well-known phenomenon. The voltage $V_{breakdown}$ required for the breakdown process depends on the pressure p of the gas, the distance across d across which the voltage difference is applied, and the secondary electron emission coefifcient γ. Hereinbelow, the relation between these parameters and the breakdown voltage is established, see, for example, N.St. J. Braithwaite, Introduction to gas discharges, Plasma Source Sci. Technol. 9 ( 2000 ) page 517. The breakdown voltage as it relates to the conditions which ay be prevalent in a lithography apparatus according to embodiments of the present inventon is discussed hereinbelow.

1. Theoretical Description of the Breakdown Process
   Ionization Mean Free Path
   After one mean free path for ionization $\lambda_i$, an electron produces on average one electron ion pair. Therefore, the increase in the number of electrons that can be expected in a infinitesimal slab of gas of thickness dx between the plates is:

$$dN = \frac{N}{\lambda_i} dx, \quad (1)$$

where N is the local number of electrons. As a result, the electron (and positive ion) population grows ('multiplies') exponentially with distance:

$$N = N_0 \exp\left[\frac{x}{\lambda_i}\right]. \quad (2)$$

Townsend's Coefficient ($\alpha$)

Townsend related the ionization mean free path to the total scattering mean free path ($\lambda$) by treating it as being a process activated by drift energy gained from the field (E$\lambda$), with an activation energy $eV_i$. This leads to a formula analogous to that of Arrhenius for thermally activated processes, giving a rate constant known as Townsend's ionization coefficient $\alpha = 1/\lambda_i = (\text{constant}/\lambda) \exp(-V_i/E\lambda)$.

Because the mean free path is inversely proportional to pressure (p), the coefficient can be written:

$$\alpha = Ap\exp\left[\frac{-Bp}{E}\right], \quad (3)$$

where the constants A and B are properties of the gas.
For Argon A=9 m$^{-1}$Pa$^{-1}$ and B=135 V m$^{-1}$Pa$^{-1}$.

Self-Sustained by Secondary Emission

Next, attention is turned to the consequences of the subsequent motion of the positive ions. Acceleration of the positive ions in the electric field leads, in principle, to secondary emission of electrons from the negative electrode, when they reach there, at a yield of $\gamma$ electrons per incident ion. The processes of secondary emission and multiplication will become self-sustaining if the ions from multiplication between x=0 (cathode) and x=d (anode) release from the cathode sufficient secondary electrons to replenish population of ions in the gap. According to equations (1) and (2), N$_0$ initial electrons will produce $\alpha$ N$_0$ exp($\alpha$x) dx ions in the slab dx at position x. Across the gap, therefore, there will be generated N$_0$[exp($\alpha$d)−1] ions. To be self-sustaining:

$$\gamma N_0[\exp(\alpha d) - 1] \geq N_0, \quad (4)$$

or $$\alpha d \geq \ln\left(1 + \frac{1}{\gamma}\right).$$

Paschen's Law

Combining (3) and (4) a self-sustaining discharge will be observed when, $$Apd\exp\left(\frac{-Bp}{E}\right) \geq \ln\left(1 + \frac{1}{\gamma}\right).$$

In planar geometry, V=Ed, so $$V_{breakdown} \geq \frac{Bpd}{\ln(Apd) - \ln\left[\ln\left(1 + \frac{1}{\gamma}\right)\right]} \quad (5)$$

At large pd, V$_{breakdown}$ increases—which is called high-pressure insulation. At some critical value of pd, V$_{breakdown}$ goes infinite—which is called vacuum insulation. In between, there is a minimum; see FIG. 2.

Figure 2:
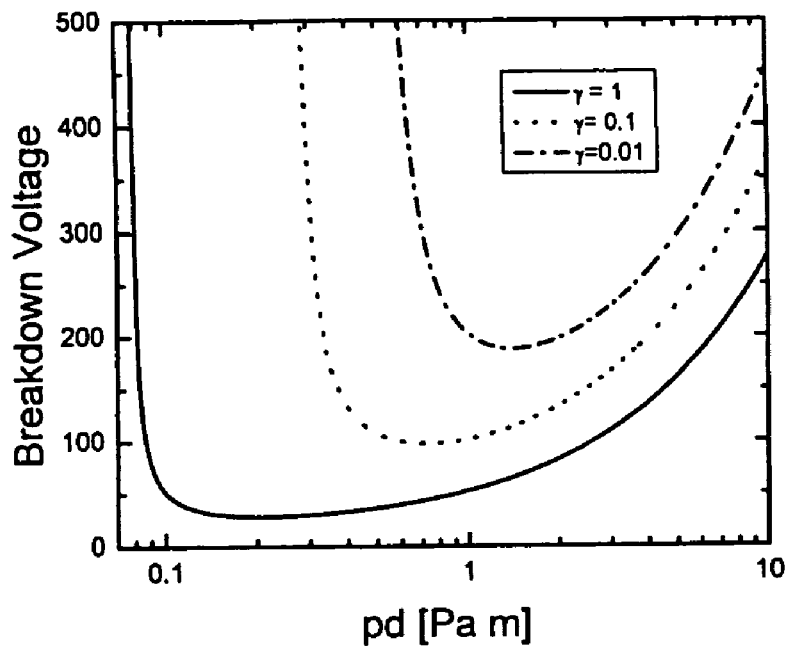
FIG. 2 shows a graph illustrating the breakdown voltage of argon gas in a uniform E-field for three different values of a secondary electron yield coefficient.

FIG. 2 shows a graph illustrating the breakdown voltage of argon gas in a uniform E-field for three different values of a secondary electron yield. In FIG. 2, the value of $\gamma$ (the secondary electron yield) is 0.01 for the dot dash line, 0.1 for the dotted line and 1 for the continuous line. It is observed that the breakdown voltage decreases with increasing secondary electron yield.

Figure 3:
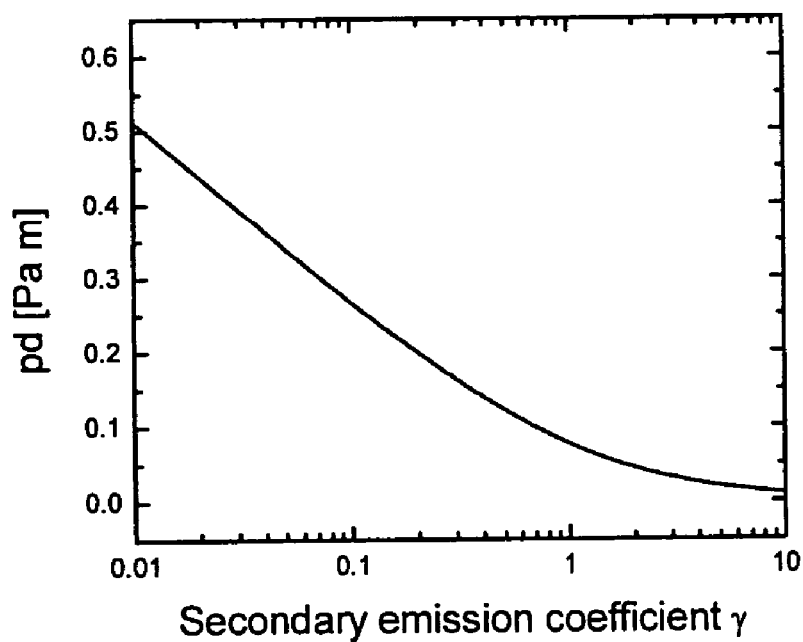
FIG. 3 shows a graph illustrating the pressure times gap distance for which vacuum insulation is reached as a function of the secondary emission coefficient.

Further, FIG. 3 shows a graph illustrating the pressure times gap distance for which vacuum insulation is reached as a function of the secondary emission coefficient.

2. Relation Between Breakdown Voltage and Tool Conditions

Typical lithographic apparatus conditions are listed in Table 1 below. With FIG. 2, these parameters can be related to the breakdown voltage. At a worst case (with $\gamma$ close to 1), a potential ≈50 volt is already sufficient for breakdown to occur. In principle, the plasma generated by the EUV radiation may provide such a potential.

The typical voltage difference between the plasma and the walls is given by:

$$V_{max} = \frac{h\nu - E_{ion}}{e} \approx 77 \text{ Volt},$$

where h$\nu$ is the photon energy (92 eV in case of 13.5 nm radiation), E$_{ion}$ is the ionization energy of argon and e is the electron charge.

TABLE 1

| Typical lithographic apparatus conditions | |
|---|---|
| Parameter | |
| Background pressure [Pa] | 0.1-10 |
| Typical distances [m] | 0.01-0.5 |
| Secondary emission coefficient (Ar$^+$ on dielectric) | 0.1-1 |

Note: the pressure of 10 Pa is in the case of hydrogen being used as a purge gas, a conventional baseline.

Figure 4:
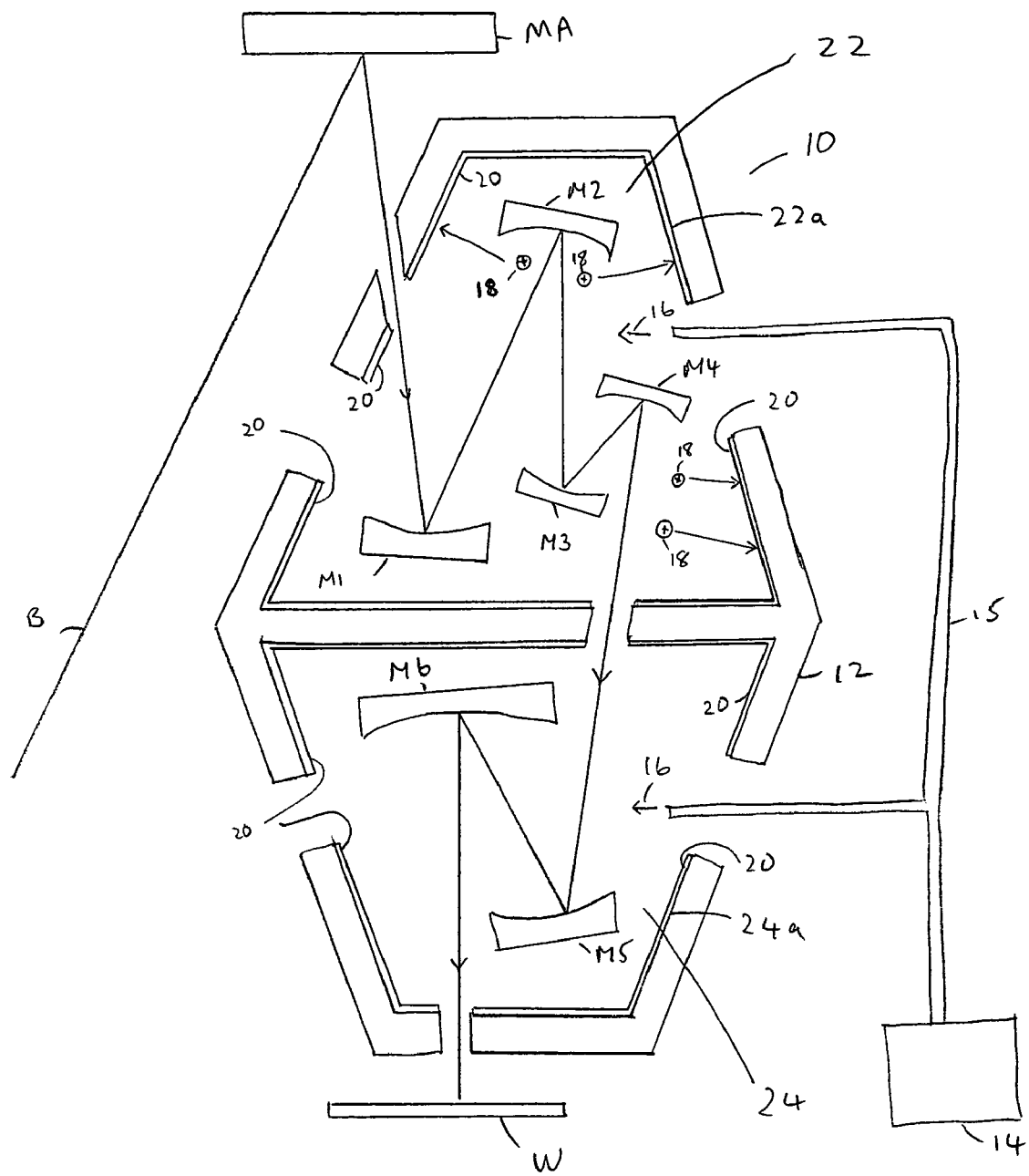
FIG. 4 depicts a support structure in a lithographic apparatus according to an embodiment of the invention.

FIG. 4 depicts a support structure in a lithographic apparatus according to an embodiment of the invention. In particular, FIG. 4 depicts a system 10 configured to project a patterned radiation beam B onto a target portion of a substrate W. The present invention may be equally applied to other systems, such as an illumination system IL (in FIG. 1) configured to condition a radiation beam. The system 10 comprises one or more optically active device M1, M2, M3, M4, M5, M6 configured to direct the patterned radiation beam B. Similarly, for embodiments where the system is an illuminator, one or more mirrors may be provided to condition the radiation beam. The one or more optically active devices M1-M6 may include one or more mirrors as shown in FIG. 4. Depending on the wavelength of the radiation, the one or more optically active device may also include one or more lenses. The system 10, PS may also comprise a support structure 12 configured to support the one or more optically active device M1-M6. The lithographic apparatus may comprise a gas supply 14 for providing a background gas 16 into the system. The gas may provide a purging function. The gas supply may be comprised in a dynamic gas lock (not shown). The gas supply may further comprise one or more conduits 15 for directing the gas to the desired locations in the support system. The gas supply may be a gas supply for supplying a gas, such as argon, as is known in the art. Alternatively, or in combination, the gas supply may supply a gas such as hydrogen or helium, as described in co-pending U.S. patent application Ser. No. 11/094,490, filed on Mar. 31, 2005, and incorporated herein by reference. The background gas may be hydrogen, helium, argon or a combination thereof. In the system, the theory of which is described above, patterned radiation beam B, or the radiation beam in an embodiment where the system is an illuminator IL, reacts with the background gas to form a plasma comprising a plurality of ions. The support structure 12 comprises an element 20. The element comprises a material having a low sputtering yield, a high sputter threshold energy or a high ion implantation yield, to reduce the sputtering degradation effects of ions and to suppress the emission of contaminants from element 20. Furthermore, element 20 may comprise a material with a small yield of secondary electrons to reduce the possibility of the plasma breaking down by reducing the number of secondary electrons present in the system. In the embodiment shown in FIG. 4, the element 20 comprises a coating of a conductive material applied to a surface of the support structure 12. In particular, the support structure may comprise an enclosure 22, 24 in which the one or more optically active devices M1-M6 may be supported. The coating 20 may be provided on an inner surface 22a, 24a of the enclosure 22, 24. In one embodiment, the coating 20 may have a thickness in the region of typically 1 micrometer or more. The conductive material may be comprised of tantalum, platinum, molybdenum, graphitic carbon or a combination thereof. A conductive coating of an inner surface of the enclosure may reduce charge build up at the walls of the enclosure due to the plasma. Non-conducting walls may lead to a negative charge build up because the mobile plasma electrons may arrive at the walls before the relatively immobile positive, for example, argon, hydrogen or helium ions do. The electric field thus created has an appropriate sign for the plasma breakdown process. In principle, 92 eV EUV-photons may create a potential difference between the grounded wall and the plasma up to 77 volts, which at certain argon pressures, for example, may be sufficient for breakdown. The potential difference between plasma and wall can be even higher for non-conductive walls increasing the probability of breakdown. The conductive coating may also have a low secondary electron emission coefficient, as described hereinbelow, as this increases the break down potential.

The surface of the one or more mirrors may be provided with a protective coating of, for example, ruthenium (Ru) atoms. In order to have a high reflectivity of the mirror, this protective coating has a limited thickness, typically of 1 nm. Without breakdown, the number of Ru atoms sputtered from the top of a multi-layer mirror may be equal to approximately $6.9 \times 10^9$ atoms/m$^2$ per EUV pulse. One square meter with a thickness of 1 nm Ru contains $7.3 \times 10^{19}$ atoms, so it may take $1.2 \times 10^{10}$ pulses to etch away one nanometer thick layer of Ru. With a source frequency of 10 kHz, this corresponds to a mirror lifetime (here defined as sputtering of 1 nm of the top coating) of approximately 330 hours. If breakdown occurs, the plasma will be higher ionized (typically 100-10000 times) compared to the case where there is no breakdown, and consequently the mirror lifetime may decrease by a factor of typically 100-10000. Thus, according to embodiments of the invention, a reduction may be achieved of the rate at which the one or more optical elements may be etched by the ions, for example argon ions, by a factor of approximately 100-10000. It is to be noted that this generally applies to an externally applied electric-field. Thus, in this way, the lifetime of the one or more optical elements may be increased.

A material having a high sputter threshold is provided in accordance with one embodiment of the invention, because ions with kinetic energy below the sputter threshold are incapable of removing material from a surface due to physical sputtering. The high sputtering threshold energy material may include platinum, tantalum, tungsten, molybdenum, graphitic carbon, or a combination thereof.

The sputter threshold energy depends on the masses of the projectile and target atoms and on the surface binding energy. In Table 2, the sputter thresholds are given for various materials and for three types of projectile ions: $Ar^+$, $He^+$ and $H^+$. The projectile ions $Ar^+$, $He^+$ and $H^+$ are formed from a background gas of argon, helium or hydrogen, respectively, depending on which gas is supplied as a background gas.

For example, in an EUV lithography apparatus, according to an embodiment of the invention, the maximum ion energy that may be expected is about 80 eV. Therefore, it may be concluded that, for argon as background gas, tungsten and graphitic carbon may be good materials. For helium as background gas, platinum, tantalum and tungsten have good properties. Further, for hydrogen as background gas, all metals listed in Table 2 have good properties. For example, in one embodiment, when the background gas is argon, the material having a high sputter threshold energy includes tungsten, graphitic carbon or a combination thereof. In a further embodiment, when the background gas is helium, the material having a high sputter threshold energy includes platinum, tantalum, tungsten or a combination thereof. In a yet further embodiment, when the background gas is hydrogen, the material having a high sputter threshold energy includes platinum, tantalum, molybdenum, tungsten or a combination thereof.

A material having a low electron emission yield, in other words a low ion induced secondary electron emission or yield, is provided in accordance with an embodiment of the invention. The occurrence of plasma breakdown in a lithography apparatus depends on the value of the ion-induced secondary electron coefficient SE, i.e. the sputtering yield (see Table 2). To protect the lithography apparatus, in one embodiment of the invention, the coating 20 comprises a material having a low electron emission yield, i.e. a low SE coefficient. In one embodiment, as shown in FIG. 4, the inside walls of the enclosure 22, 24 are coated. In another embodiment, the inside walls of the apparatus may be coated. As mentioned, the coating may include a low sputtering yield material having also a low ion-induced secondary electron coefficient. The low secondary electron yield material may include platinum, tantalum or graphitic carbon or a combination thereof. Combinations of these materials may also be provided.

TABLE 2

Sputter thresholds (in eV) and Ion-Induced Secondary Electron yields.

| Projectile\Target | | Pt | Ta | Mo | W | C |
|---|---|---|---|---|---|---|
| Sputter Threshold [eV] | $Ar^+$ | 22.5 | 27.1 | 30.9 | 34 | 70.1 |
| | $He^+$ | 83.1 | 108 | 55.0 | 120 | 28.7 |
| | $H^+$ | 297 | 382 | 177 | 427 | 38.6 |
| SE [e$^-$/ion] | $Ar^+$ | 0.02 | 0.008 | 0.08 | 0.1 | ? |

The sputter thresholds given in Table 2 are derived from Y. Yamamura and H. Tawara, Atom. Data and Nucl. Data Tables 62, 149 (1996). The SE coefficients given in Table 2 are derived from A. V. Phelps and Z. L. Petrovic, Plasma Sources Sc. Technol. 8, R21 (1999).

From Table 2, it may be deduced that carbon may form an advantageous coating for sputtering with argon, while the heavy metals like Ta/W may form an advantageous coating for sputtering of light gasses, such as hydrogen and helium. With respect to a material having a low ion-induced secondary electron yield, the most advantageous effects are achieved with a coating of tantalum. In an embodiment, where carbon is provided as a coating, a further advantage is that when carbon is sputtered, any redeposition on an optically active device is not a problem, since carbon may be readily cleaned. The same applies to Ru, since Ru may be provided as a top (coating) material on an optically active device.

FIGS. 5 to 9 depict further embodiments of the present invention. There are a number of parameters that may influence the etching/sputtering yield, including, but not limited to, the material of the coating, also herein referred to as an ion target. The sputtering yield may strongly depend on the targeted material. As shown in FIG. 4, in one embodiment, a coating of a low sputtering yield is provided to define ion targets. Further, parts of structures, for example, the support structure or additional parts made of a low sputtering yield, also referred to as sputtering traps, may be provided. Ions may be attracted or deflected to the sputtering traps by, for example, by electrical fields, as shown for example, in FIG. 5, alternatively, or in addition, ions may be deflected by a magnetic field.

Figure 6:
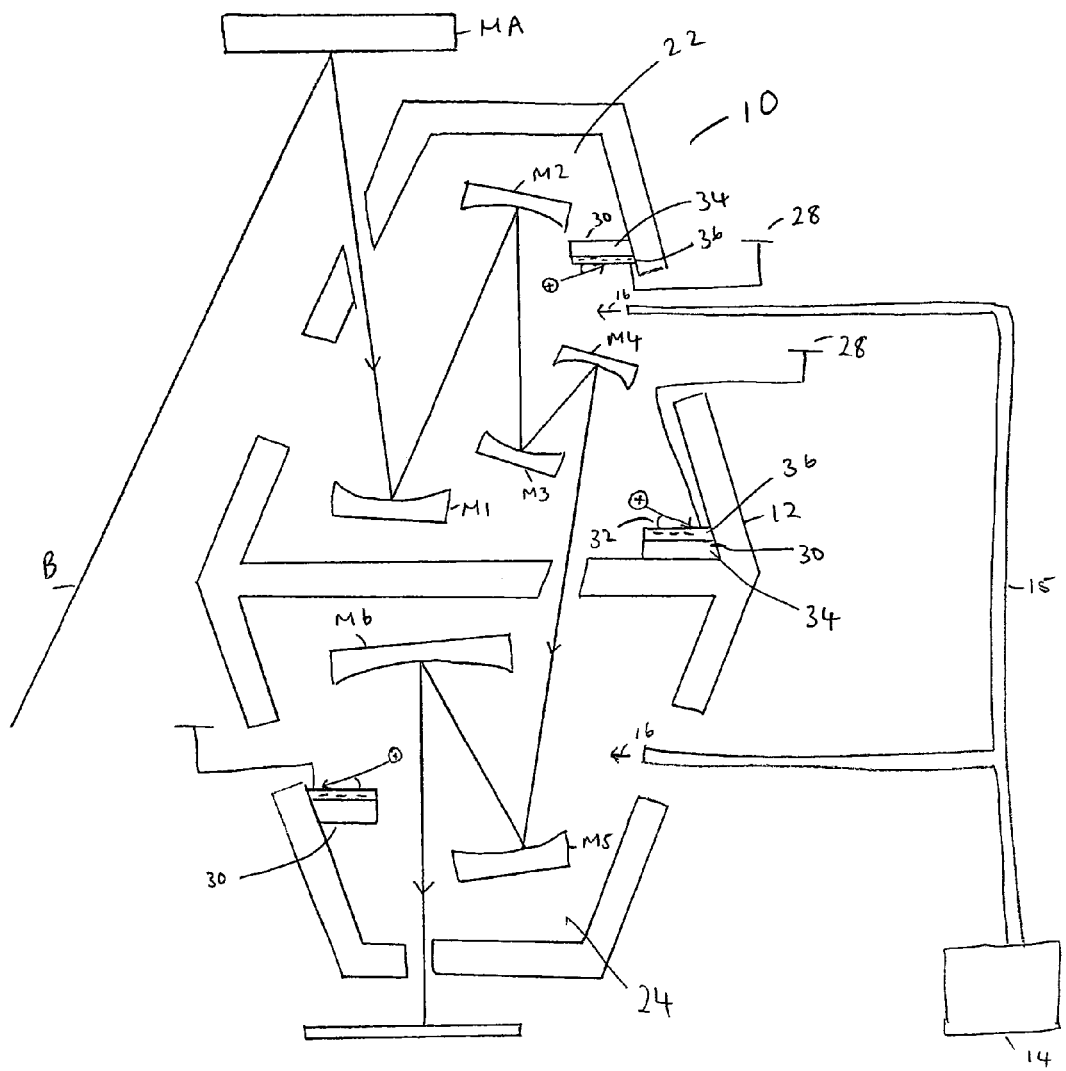
FIG. 6 depicts a support structure in a lithographic apparatus according to another embodiment of the invention.

A further parameter is the angle of incidence of the ions, as depicted in FIG. 6. The energy at which sputtering is efficient may depend on the energy of the ions. When the energy is relatively small, for example, less than or equal to around 100 eV, a grazing angle leads to smaller sputtering yields. Again, a high angle of incidence may be engineered with a sputtering trap.

Figure 7:
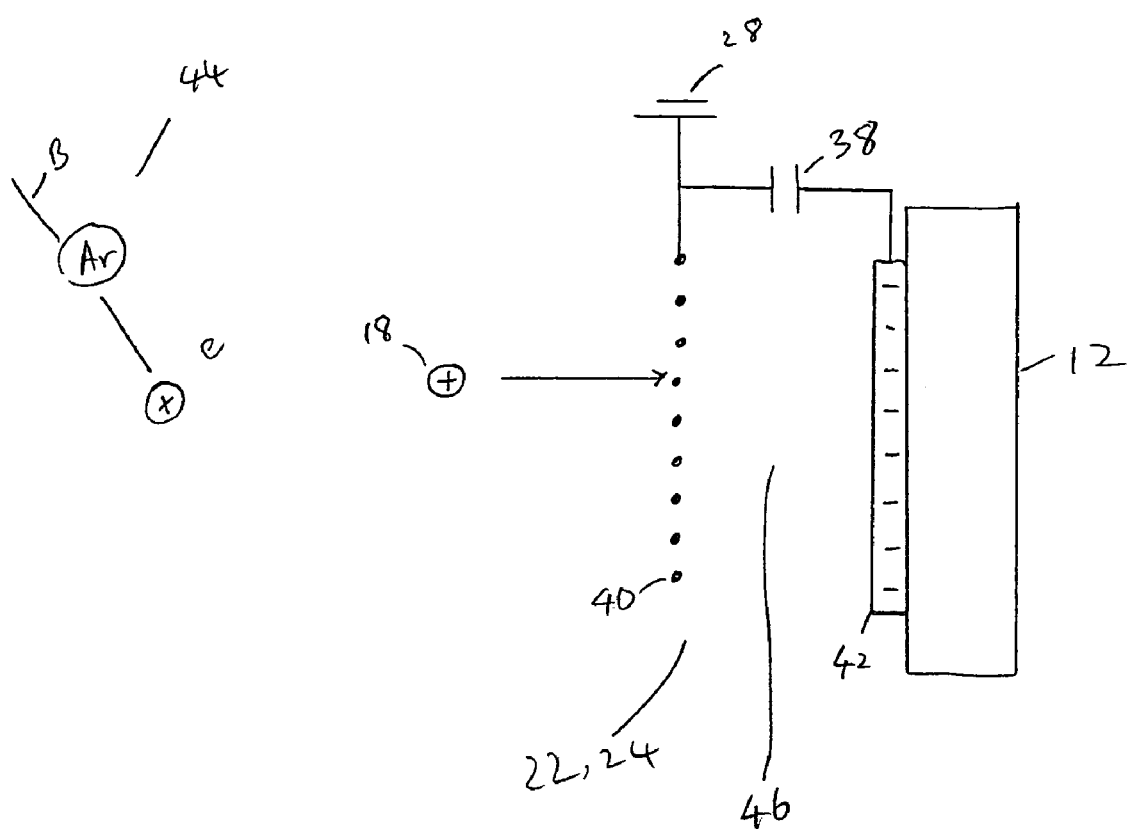
FIG. 7 depicts a detail of a support structure in a lithographic apparatus according to another embodiment of the invention.
Figure 8:
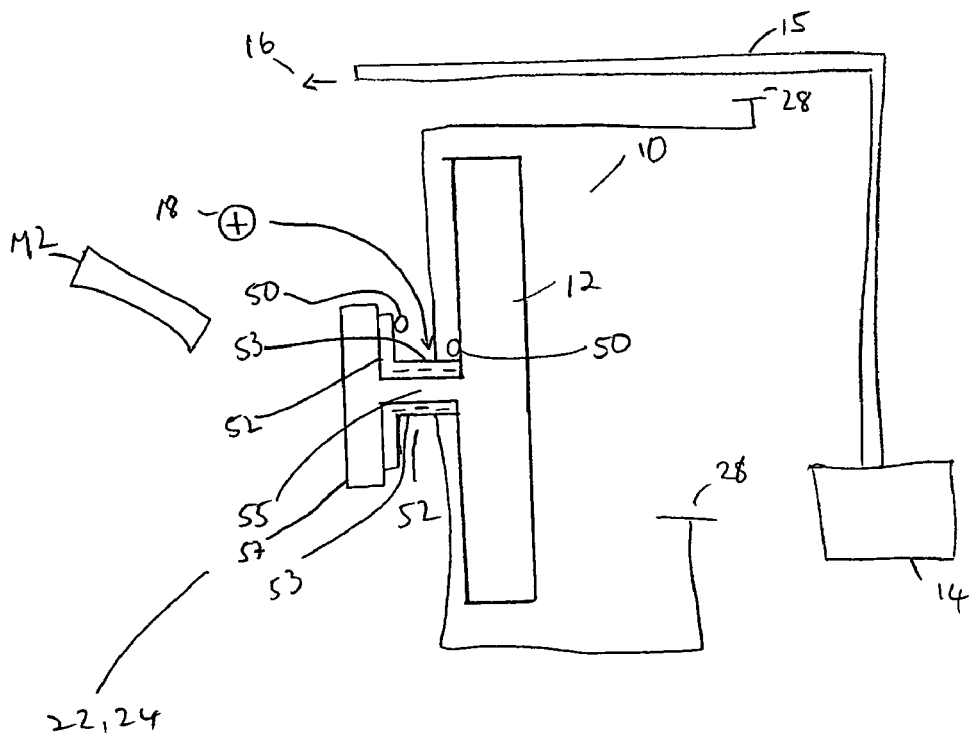
FIG. 8 depicts a sputtering trap mounted on a support structure in a lithographic apparatus according to an embodiment of the invention.
Figure 9:
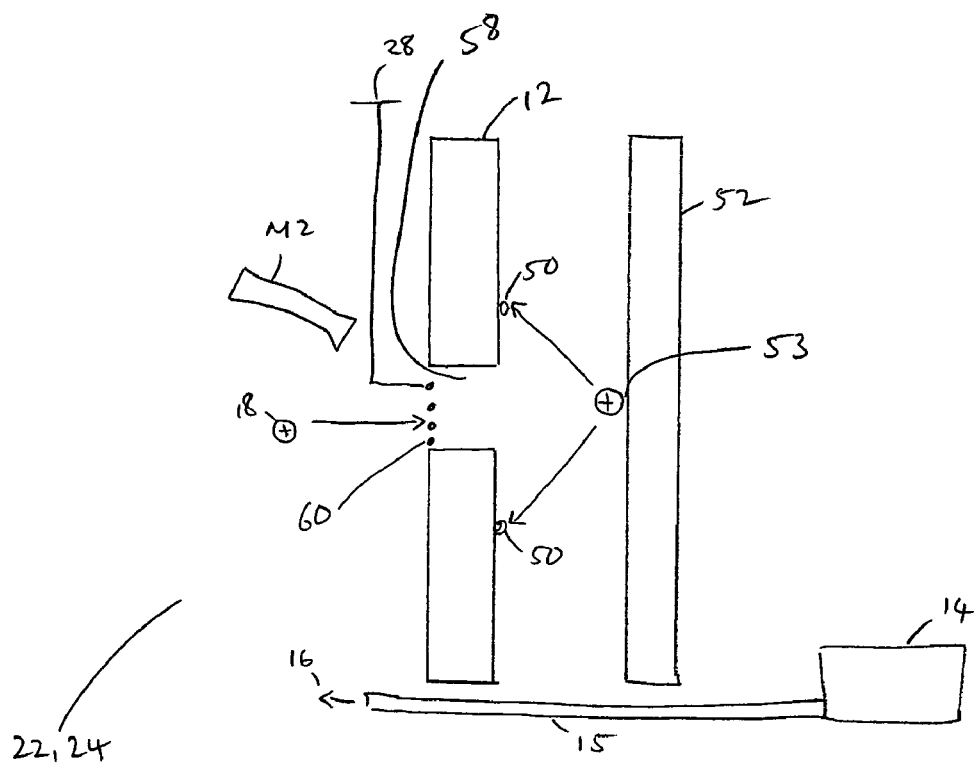
FIG. 9 depicts a sputtering trap incorporated in a support structure and an additional apparatus element in a lithographic apparatus according to another embodiment of the invention.

A further parameter may be the energy of the ions. The sputtering yields may show a maximum as a function of the energy. At low energy, for example, less than or equal to around 10 eV, the sputtering may be small due to the small energy. At higher energies, for example, kV, the ions may get entrapped in the target. In other words, they may become implanted in the target, as shown in FIG. 7. The energy may be tuned by decelerating, accelerating or deflecting or a combination thereof, the particles before they reach the target. This may be achieved by applying an electrical or magnetic field, for example. As depicted in FIGS. 8 and 9, in addition, or as an alternative to decreasing the sputtering yield, the likelihood that a sputtering product reaches the one or more optical elements may be decreased. This may be achieved, for example, as shown in FIGS. 8 and 9, by decreasing a line of sight between an ion target and the to be protected one or more optical elements. This may be achieved by accelerating the plurality of ions around a corner, as shown in FIG. 8, by for example, an electrical or magnetic field. In addition, or alternatively, this may be achieved by accelerating the plurality of ions to outside the enclosure in which the one or more optical elements are disposed. This may be achieved by providing an opening in the support structure.

Further, an attracting mesh may be applied across at least a portion of the opening to which the ions are attracted, for example, by applying an electrical field to the mesh.

Figure 5:
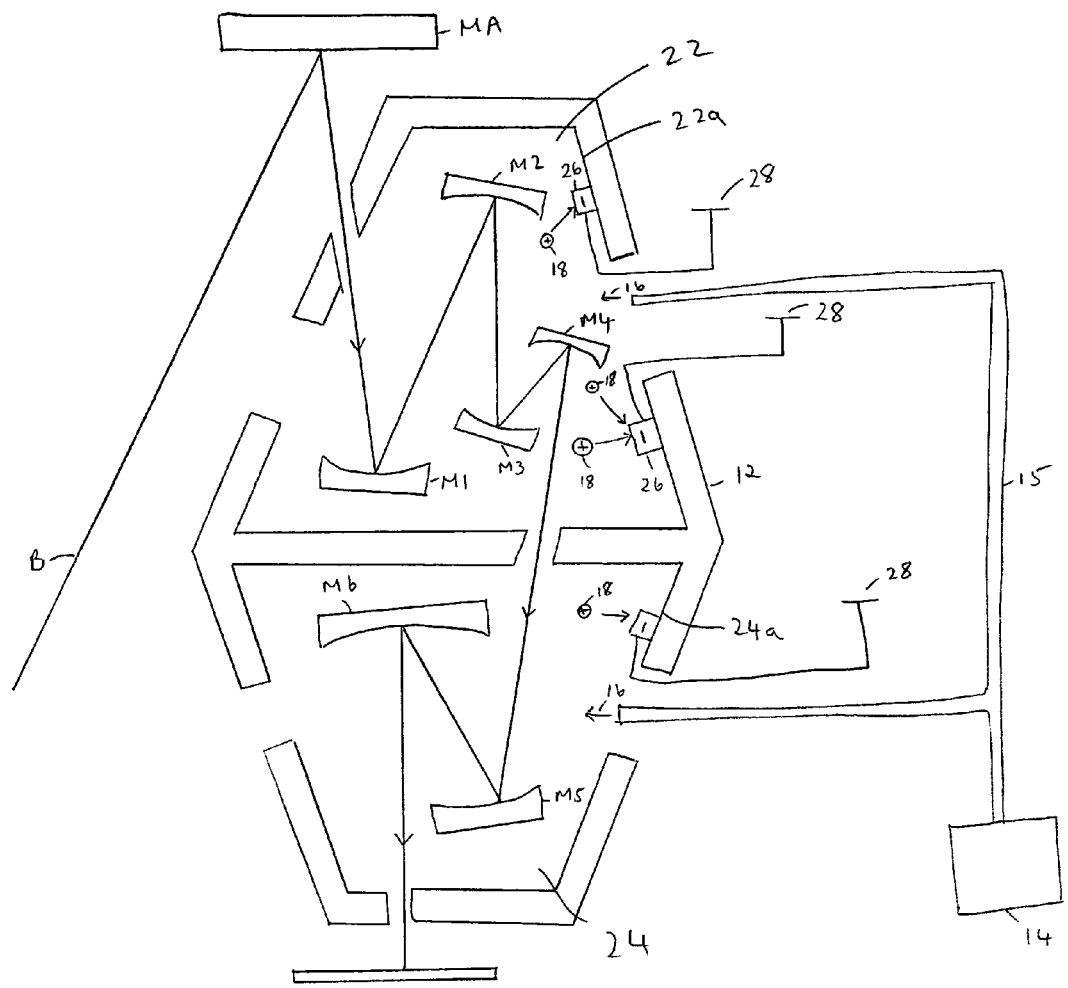
FIG. 5 depicts a support structure in a lithographic apparatus according to another embodiment of the invention.

In more detail, FIG. 5 depicts a support structure 12 in a lithographic apparatus according to a further embodiment of the invention as briefly described above. In particular, FIG. 5 depicts a voltage supply 28. The voltage supply 28 is configured to hold the element 26 at a potential having an opposite sign to an electrical charge of the plurality of ions, so that the plurality of ions are attracted to the element. The application of an electrical field may provide benefits under certain circumstances. When an external electric field is applied, the charge carriers in the plasma reorganize in order to neutralize the electrical field. The penetration of an electrical field can be determined by the Debye length. The Debye length, $\lambda$, is determined in accordance with:

$$\lambda^2 = \frac{\varepsilon_0 k_B T_e}{n_e e^2} \quad (6)$$

where $\lambda$ is the Debye length, $\varepsilon_0$ is the vacuum permittivity (8.85E-12 F/m), $k_B$ is the Boltzmann's constant (1.38E-23 joule/K), $T_e$ is the electron temperature (K), and $n_e$ is the electron number density (1/m$^3$) and e is the charge of electron (1.6E-19 coulomb).

An external electrical field may penetrate a plasma over a length given by the Debye length. When, for example, the Debye length is larger than a typical scale in the lithography tool, the application of an electrical field may be carried out in the complete gas environment.

Further, the penetration of an electric field depends on the density of electrons in the plasma, which in turn depends on the pressure of the background gas and on the grade of ionisation (e.g. the absorbed amount of ionising light in the gas). For pressure ranges of background gas of around $10^{-1}$ Pa or higher, an electric field may not provide additional benefits. However, at relatively low pressure, for example, where the pressure of the background gas is around the order of $10^{-1}$ Pa or less, an electric field may penetrate the plasma more effectively, causing the ions to be attracted to the element to which a potential is applied. It may be noted that the threshold pressure may depend on a variety of factors including, but not limited to absorption of EUV, SE, typical dimensions, kind of gas, . . . etc.

The support structure 12 may comprise an enclosure 22, 24 in which the one or more optically active devices M1-M6 is/are supported. The element may be a coating as shown in FIG. 4. Alternatively, or in addition, the element may comprise a block 26 of material having at least a conductive outer layer mounted to an inner surface 22a, 24a of the support structure 12.

FIG. 6 depicts a support structure in a lithographic apparatus according to a yet further embodiment of the invention. In FIG. 6, the support structure 12 again, may comprise an enclosure 22, 24 in which the one or more optically active devices M1-M6 is/are supported. The element 30 may be mounted on an inner surface 22a of the enclosure and may be configured to extend into the enclosure 22 in such a manner that the plurality of ions 18 impinge on the element 30 at a relatively high angle of incidence 32. In this way the sputtering yield of the plurality of ions is reduced. Further, a voltage supply 28 may be provided for holding the element 30 at a potential opposite in sign to the sign of a charge borne by the plurality of ions 18. Further, the element 30 may comprise a first portion 34 forming a support and a second portion 36 disposed on the first portion 34. The second portion 36 may comprise a conductive material. In the embodiment shown in FIG. 6, the energy of the plurality of ions is around 100 eV or less.

FIG. 7 depicts a detail of a support structure in a lithographic apparatus according to a yet further embodiment of the invention. As described above, a further parameter may be the energy of the ions. At higher energies, for example, keV, the ions may get entrapped in the target. In other words, they may be come implanted in the target, as shown in FIG. 7. In the embodiment shown in FIG. 7, an accelerating electric field producing unit 28, 38, 40 may be provided, configured to accelerate the plurality of ions 18 towards the element 42. The element 42 may comprise a material having a high ion implantation yield, so that at least a proportion of the plurality of ions are implanted in the material. The element 42 is provided with at least a conductive coating. In this way, the electrical field may attract the plurality of ions to the element 42. Further, the material having a high ion implantation yield may be conductive.

The energy of the plurality of ions may be tuned by decelerating or accelerating, in the case of an electric field, or deflecting, in the case of a magnetic field, the particles before they reach the target. This may be achieved by applying an electrical or magnetic field, respectively. In FIG. 7 an electrical field is generated. However, in a further embodiment a magnetic field may be generated for achieving a different angle or deflection of the particles.

The accelerating electric field producing unit 28, 38, 40 comprises a conductive grid 40 disposed in the enclosure 22, 24 between a source 44 of the plurality of ions and the element 42. Further, a voltage supply 28 may be provided for providing a potential between the conductive grid 40 and the element 42. The source 44 may be the projection beam B incident on the background gas, for example, Ar. The mechanism for the production of the ions is described above. In one embodiment, the potential applied by the voltage supply 28 is opposite to a charge borne by the plurality of ions 18, so that the plurality of ions in a region 46 between the grid 40 and the element 42 are accelerated towards the element 42. In an alternative embodiment, an decelerating electric field producing unit 28, 38, 40 may be provided which is configured to decelerate the plurality of ions 18 towards the element 42 comprising a material having a low sputtering yield, so that at least a proportion of the plurality of ions are decelerated so that they have an energy below a sputtering energy threshold of the material. For example, the decelerating electric field producing unit 28, 38, 40 comprises a conductive grid 40 disposed in the enclosure 22, 24 between a source 44 of the plurality of ions 18 and the element 42 and a voltage supply 28 for providing a potential between the conductive grid 40 and the element 42. This may be achieved for example, by applying a potential by the voltage supply having the same sign as the charge borne by the plurality of ions. In one embodiment, the element 42 is held at a potential lower than the potential at which the grid 40 is held, so that initially, the ions are attracted towards the grid 40 and the, subsequently, towards the element 42. In this way, it is avoided that the ions may be decelerated or turned around before reaching the element 42. In other words, there may be a negative voltage drop between grid 40 and element 42. It is to be noted that in FIG. 7, an accelerating electric field producing unit is shown. A decelerating unit is provided by reversing the polarity of the potential applied to the element 42. Thus, the apparatus shown in FIG. 7 is suitable for use as a decelerating electric field producing unit by changing the polarity of the charge on element 42.

FIGS. 8 and 9 depict details of a system as depicted in FIGS. 4-7. FIG. 8 depicts a sputtering trap mounted on a support structure in a lithographic apparatus according to an embodiment of the invention. As described above, it is a further desirable to reduce the chances of any sputtering products reaching the one or more optically active devices. This may be achieved, as shown in the embodiments depicted in FIGS. 8 and 9, by a system IL or PS, 10 configured to condition a radiation beam or project a patterned radiation beam onto a target portion of a substrate, respectively. The system may comprise one or more optically active devices M1-M6 configured to direct the radiation beam B or the patterned radiation beam B, respectively, and a support structure 12 configured to support the one or more optically active device. The apparatus may further comprise a gas supply 14, 15 for providing a background gas 16 into the system. In the system 10, the radiation beam or patterned radiation beam may react with the background gas 16 to form a plasma comprising a plurality of ions 18, wherein the plurality of ions 18 generate a plurality of sputter products 50 as a result of an impact of the plurality of ions 18 with the system. The support structure 12 may further comprise an element 52 configured to decrease the likelihood that the sputtering products 50 reach the one or more optically active devices M1-M6. In the embodiment shown in FIG. 7, the element 52 may comprise an ion target 53 towards which at least a proportion of the plurality of ions are directed. At the ion target 53 sputtering may occurs. The element 52 in FIGS. 8 and 9, may be configured to decrease the line of sight between the ion target 53 and the one or more optically active devices M1-M6; in FIGS. 8 and 9, the line of sight is decreased between mirror M2 and the ion target 53. In further embodiments, the ion target 53 may be configured with respect to other optical elements M1, M3-M6, to decrease the line of sight between the ion target 53 and the other optical elements. In one embodiment, the element 52 is connected to a voltage supply 28 for providing a potential to the ion target 53 to attract the plurality of ions to the ion target. In a further embodiment, a magnet may be provided which may be configured to provide a magnetic field to deflect the plurality of ions towards the ion target 53. As seen in FIG. 8, the element 52 may be configured to provide a corner around which the ion target 53 is located, so that the plurality of ions are attracted around the corner to the ion target 53. The support structure 12 may comprise an enclosure 22, 24 in which the one or more optically active devices M1-M6 may be supported. The element 53 may comprise a third portion 55 which extends into the enclosure 22, 24, a fourth portion 57 cojoined with the third portion 55, extending in a direction at an angle with the third portion 55, to form the corner around which the ion target 53 is located.

FIG. 9 depicts a sputtering trap incorporated in a support structure and an additional apparatus element in a lithographic apparatus according to a further embodiment of the invention. In the embodiment shown in FIG. 9, the support structure 12 may comprises an enclosure 22, 24 in which the one or more optically active devices M1-M6 is/are supported. The ion target 53 may be disposed outside of the enclosure 22, 24. The support structure 12 may be provided with an opening 58 across at least a portion of which an attracting mesh 60 may be arranged so that at least a proportion of the plurality of ions 18 are attracted towards the mesh 60. The attracting mesh may comprise a voltage supply 28 for holding the mesh at a desired potential. The ion target 53 may be disposed in a region adjacent the mesh 60, so that the at least a proportion of the plurality of ions are attracted out of the enclosure to the ion target 53. In one embodiment, the ion target 53 is located on the base frame.

Although specific reference may be made in this text to the use of lithographic appartus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure, herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning divice defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" as used herein encompass all types of electromagnetic gnetic radiation, including ultraviolet (UV) radiation (e.g. having a wavelength of or about 365, 355, 248, 193, 157 or 126 nm) and extreme ultraviolet (EUV) radiation (e.g. having a wavelength in the range of 5-20 nm), as well as particle beams, such as ion beams or electron The term "lens", where the context allows, may refer to any one or combination of various types of optical components, including refractive, reflective, magnetic, electromagnetic and electrostatic optical components.

While specific embodiments of the invention have been described above, it will be ed that the invention may be practiced otherwise than as described. For example, the may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   a system configured to condition a radiation beam comprising extreme ultraviolet or ultraviolet radiation received from a radiation source or project a patterned radiation beam onto a target portion of a substrate, the system comprising:
      an optically active device configured to direct the radiation beam or the patterned radiation beam, respectively, and
      a support structure configured to support the optically active device, the support structure comprising an element comprising a material having a low sputtering yield, a high sputter threshold energy, or a high ion implantation yield, to reduce an effect of ions, or comprising a material with a low yield of secondary electrons on ion impact to reduce the probability of plasma breakdown; and
      a gas supply configured to provide a background gas into the system, the radiation beam or patterned radiation beam interacting with the background gas to form a plasma comprising a plurality of ions.

2. An apparatus according to claim 1, wherein the element comprises a coating of a conductive material applied to a surface of the support structure.

3. An apparatus according to claim 2, wherein the support structure comprises an enclosure in which the optically active device is supported, wherein the coating is provided on an inner surface of the enclosure.

4. An apparatus according to claim 2, wherein the coating has a thickness in the region of 1 micrometer or more.

5. An apparatus according to claim 1, further comprising a voltage supply configured to hold the element at a potential.

6. An apparatus according to claim 5, wherein the element is held at a potential having an opposite sign to an electrical charge of the plurality of ions, so that the plurality of ions are attracted to the element.

7. An apparatus according to claim 5, wherein the element is held at a negative potential.

8. An apparatus according to claim 5, wherein the support structure comprises an enclosure in which the optically active device is supported, wherein the element comprises a block of material having at least a conductive outer layer mounted to an inner surface of the support structure.

9. An apparatus according to claim 1, wherein the support structure comprises an enclosure in which the optically active device is supported, wherein the element is mounted on an inner surface of the enclosure and is configured to extend into the enclosure in such a manner that the plurality of ions impinge on the element at a relatively high angle of incidence, wherein an energy of the plurality of ions impinging on the element is reduced, so that the sputtering yield of the plurality of ions is reduced.

10. An apparatus according to claim 9, further comprising a voltage supply for holding the element at a potential opposite to a charge borne by the plurality of ions.

11. An apparatus according to claim 9, wherein the element comprises a first portion forming a support and a second portion disposed on the first portion, the second portion comprising a conductive material.

12. An apparatus according to claim 9, wherein the energy of the plurality of ions is around 100 eV or less.

13. An apparatus according to claim 1, further comprising an accelerating electric field producing unit configured to accelerate the plurality of ions towards the element comprising a material having a high ion implantation yield, so that at least a proportion of the plurality of ions are implanted in the material.

14. An apparatus according to claim 13, wherein the material having a high ion implantation yield is conductive.

15. An apparatus according to claim 14, wherein the accelerating electric field producing unit comprises a conductive grid disposed in the enclosure between a source of the plurality of ions and the element and a voltage supply for providing a potential between the conductive grid and the element.

16. An apparatus according to claim 15, wherein the potential applied by the voltage supply is opposite to a charge borne by the plurality of ions, so that the plurality of ions in a region between the grid and the element are accelerated towards the element.

17. An apparatus according to claim 16, wherein the element is held at a potential lower than the potential at which the grid is held, so that initially, the ions are attracted towards the grid and then, subsequently, towards the element.

18. An apparatus according to claim 1, further comprising a decelerating electric field producing unit configured to decelerate the plurality of ions towards the element comprising a material having a low sputtering yield, so that at least a proportion of the plurality of ions are decelerated so that they have an energy below a sputtering energy threshold of the material.

19. An apparatus according to claim 18, wherein the decelerating electric field producing unit comprises a conductive grid disposed in the enclosure between a source of the plurality of ions and the element and a voltage supply for providing a potential between the conductive grid and the element.

20. An apparatus according to claim 19, wherein the potential applied by the voltage supply is the same as the charge borne by the plurality of ions.

21. An apparatus according to claim 1, wherein the background gas comprises argon, helium, hydrogen, or a combination thereof.

22. An apparatus according to claim 1, wherein the low sputtering yield material, the high threshold material and/or the high implantation material has a low ion-induced secondary electron coefficient.

23. An apparatus according to claim 1, wherein the low sputtering yield material includes platinum, tantalum, graphitic carbon, or a combination thereof.

24. An apparatus according to claim 1, wherein the high sputtering threshold energy material includes platinum, tantalum, tungsten, molybdenum, graphitic carbon, or a combination thereof.

25. An apparatus according to claim 1, wherein the pressure of the background gas is about $10^{-1}$ Pa or less.

26. A lithographic apparatus comprising:
a system configured to condition a radiation beam comprising extreme ultraviolet or ultraviolet radiation received from a radiation source or project a patterned radiation beam onto a target portion of a substrate, the system comprising:
an optically active device configured to direct the radiation beam or the patterned radiation beam, respectively, and
a support structure configured to support the optically active device, the support structure comprising an element configured to reduce an effect of ions, or comprising a material with a low yield of secondary electrons on ion impact to reduce the probability of plasma breakdown by decreasing the possibility that the sputtering products reach the optically active device; and
a gas supply configured to provide a background gas into the system, the radiation beam or patterned radiation beam interacting with the background gas to form a plasma comprising a plurality of ions, the plurality of ions generating a plurality of sputter products as a result of an impact of the plurality of ions with the system.

27. An apparatus according to claim 26, wherein the element comprises an ion target towards which at least a proportion of the plurality of ions are directed, at which ion target sputtering occurs, the element being configured to decrease the line of sight between the ion target and the optically active device.

28. An apparatus according to claim 26, wherein the element is connected to a voltage supply configured to provide a potential to an ion target to attract the plurality of ions to the ion target.

29. An apparatus according to claim 27, further comprising a magnet configured to provide a magnetic field to deflect the plurality of ions to the ion target.

30. An apparatus according to claim 29, wherein the element is configured to provide a corner around which the ion target is located, so that the plurality of ions are attracted around the corner to the ion target.

31. An apparatus according to claim 30, wherein the support structure comprises an enclosure in which the optically active device is supported, and wherein the element comprises a first portion which extends into the enclosure, and a second portion cojoined with the first portion, extending in a direction at an angle with the first portion, to form the corner around which the ion target is located.

32. An apparatus according to claim 26, wherein the support structure comprises an enclosure in which the optically active device is supported, and an ion target disposed outside of the enclosure.

33. An apparatus according to claim 32, wherein the support structure is provided with an opening across at least a portion of which an attracting mesh is arranged so that at least a proportion of the plurality of ions are attracted towards the mesh.

34. An apparatus according to claim 33, wherein the element is held at a potential lower than the potential at which the mesh is held, so that initially, the ions are attracted towards the mesh and then, subsequently, towards the element.

35. An apparatus according to claim 33, wherein the ion target is disposed in a region adjacent the mesh, so that the at least a proportion of the plurality of ions are attracted out of the enclosure to the ion target.

36. An apparatus according to claim 27, wherein the ion target is located on a base frame of the lithographic apparatus.

37. An apparatus according to claim 26, wherein the background gas comprises argon, helium, hydrogen, or a combination thereof.

38. An apparatus according to claim 26, wherein the low sputtering yield material, the high threshold material and/or the high implantation material has a low ion-induced secondary electron coefficient.

39. An apparatus according to claim 26, wherein the low sputtering yield material includes platinum, tantalum, graphitic carbon, or a combination thereof.

40. An apparatus according to claim 26, wherein the high sputtering threshold energy material includes platinum, tantalum, tungsten, molybdenum, graphitic carbon, or a combination thereof.

41. An apparatus according to claim 37, wherein when the background gas is argon, the material having a high sputter threshold energy includes tungsten, graphitic carbon, or a combination thereof.

42. An apparatus according to claim 37, wherein when the background gas is helium, the material having a high sputter threshold energy includes platinum, tantalum, tungsten, or a combination thereof.

43. An apparatus according to claim 37, wherein when the background gas is hydrogen, the material having a high sputter threshold energy includes platinum, tantalum, molybdenum, tungsten, or a combination thereof.

44. An apparatus according to 26, wherein the pressure of the background gas is about $10^{-1}$ Pa or less.

45. A lithographic projection apparatus arranged to project a pattern from a patterning device onto a substrate, comprising:
a system configured to condition a radiation beam comprising extreme ultraviolet or ultraviolet radiation received from a radiation source or project a patterned radiation beam onto a target portion of the substrate, the system comprising:

an optically active device configured to direct the radiation beam or the patterned radiation beam, respectively, and a support structure configured to support the optically active device, the support structure comprising an element comprising a material having a low sputtering yield, a high sputter threshold energy, or a high ion implantation yield, to reduce an effect of ions, or comprising a material with a low yield of secondary electrons on ion impact to reduce the probability of plasma breakdown; and a gas supply configured to provide a background gas into the system, the radiation beam or patterned radiation beam reacting with the background gas to form a plasma comprising a plurality of ions.

46. A system configured to condition a radiation beam or project a patterned radiation beam onto a target portion of a substrate, the system comprising:

an optically active device configured to direct the radiation beam comprising extreme ultraviolet or ultraviolet radiation received from a radiation source or the patterned radiation beam, respectively;

a support structure configured to support the optically active device, the support structure comprising an element comprising a material having a low sputtering yield, a high sputter threshold energy, or a high ion implantation yield, to reduce an effect of ions, or comprising a material with a low yield of secondary electrons on ion impact to reduce the probability of plasma breakdown; and a gas supply configured to provide a background gas into the system, the radiation beam or patterned radiation beam reacting with the background gas to form a plasma comprising a plurality of ions.

47. A device manufacturing method, comprising:

projecting a patterned beam of radiation through a system onto a target portion of a substrate or conditioning a radiation beam comprising extreme ultraviolet or ultraviolet radiation received from a radiation source in a system;

directing the radiation beam or the patterned radiation beam through the system using an optically active device;

supporting the optically active device with a support structure;

supplying a gas supply for providing a background gas into the system, the radiation beam or patterned radiation beam interacting with the background gas to form a plasma comprising a plurality of ions, and reducing an effect of ions with an element in the support structure, the element comprising a material having a low sputtering yield, a high sputter threshold energy, a high ion implantation yield, or a low yield of secondary electrons on ion impact, to reduce the probability of plasma breakdown.

* * * * *